United States Patent
Fonseca Junior et al.

(10) Patent No.: US 12,292,696 B2
(45) Date of Patent: May 6, 2025

(54) FLUID PURGING SYSTEM, PROJECTION SYSTEM, ILLUMINATION SYSTEM, LITHOGRAPHIC APPARATUS, AND METHOD

(71) Applicant: ASML Netherlands B.V., Veldhoven (NL)

(72) Inventors: José Nilton Fonseca Junior, Hamburg (DE); Franciscus Johannes Leonardus Heutz, Dommelen (NL); Zhuangxiong Huang, Eindhoven (NL); Ferdy Migchelbrink, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 110 days.

(21) Appl. No.: 18/008,409

(22) PCT Filed: Apr. 30, 2021

(86) PCT No.: PCT/EP2021/061374
§ 371 (c)(1),
(2) Date: Dec. 5, 2022

(87) PCT Pub. No.: WO2021/244808
PCT Pub. Date: Dec. 9, 2021

(65) Prior Publication Data
US 2023/0205102 A1 Jun. 29, 2023

(30) Foreign Application Priority Data
Jun. 4, 2020 (EP) .................................. 20178213

(51) Int. Cl.
*G03F 7/20* (2006.01)
*G02B 27/00* (2006.01)
*G03F 7/00* (2006.01)

(52) U.S. Cl.
CPC ..... *G03F 7/70933* (2013.01); *G02B 27/0006* (2013.01); *G03F 7/70833* (2013.01)

(58) Field of Classification Search
CPC ............. G03F 7/70933; G03F 7/70833; G02B 27/0006; G02B 7/02
See application file for complete search history.

(56) References Cited

U.S. PATENT DOCUMENTS 6,952,253 B2  10/2005  Lof et al.
10,983,448 B2  4/2021  Li et al.
(Continued)

FOREIGN PATENT DOCUMENTS

CN  201907274 U  7/2011
CN  103737928 A  4/2014
(Continued)

OTHER PUBLICATIONS

International Search Report and Written Opinion of the International Searching Authority directed to related International Patent Application No. PCT/EP2021/061374, mailed Jul. 29, 2021; 11 pages.
(Continued)

*Primary Examiner* — Mesfin T Asfaw
(74) *Attorney, Agent, or Firm* — Sterne, Kessler, Goldstein & Fox P.L.L.C.

(57) ABSTRACT

The present invention provides a fluid purging system (100) for an optical element (30), comprising a ring and a fluid supply system (40). The ring being formed of a body entirely surrounding the optical element, the ring defining a space (5) radially inwards thereof and adjacent to the optical element. The ring is formed by at least one first wall portion (10) and at least one second wall portion (20A; 20B), wherein an average height of the first wall portion is greater than an average height of the second wall portion. The fluid supply
(Continued)

system is positioned radially outwards of the ring and configured to supply fluid to pass over the at least one second wall portion to the space.

20 Claims, 4 Drawing Sheets

(56) References Cited

U.S. PATENT DOCUMENTS

| | | |
|---|---|---|
| 2002/0191163 A1 | 12/2002 | Hasegawa et al. |
| 2005/0206862 A1 | 9/2005 | Tanaka et al. |
| 2006/0146300 A1 | 7/2006 | Simon et al. |
| 2011/0128516 A1 | 6/2011 | Kaneko et al. |
| 2015/0093883 A1 | 4/2015 | Moriyama et al. |
| 2017/0102539 A1 | 4/2017 | Brehm et al. |
| 2019/0137895 A1 | 5/2019 | Sugita et al. |
| 2019/0187561 A1 | 6/2019 | Hao et al. |
| 2020/0166856 A1* | 5/2020 | Li ................ G03F 7/70916 |

FOREIGN PATENT DOCUMENTS

| | | |
|---|---|---|
| CN | 109283797 A | 1/2019 |
| JP | 2002-373849 A | 12/2002 |
| JP | 2003-203866 A | 7/2003 |
| JP | 2004-214552 A | 7/2004 |
| JP | 2005-332972 A | 12/2005 |
| WO | WO 2005/101121 A2 | 10/2005 |

OTHER PUBLICATIONS

International Preliminary Report on Patentability directed to related International Patent Application No. PCT/EP2021/061374, issued Dec. 6, 2022; 7 pages.

Korean Office Action directed to Korean Patent Application No. 2022-7043113, mailed Jan. 20, 2025; 16 pages.

* cited by examiner

FLUID PURGING SYSTEM, PROJECTION SYSTEM, ILLUMINATION SYSTEM, LITHOGRAPHIC APPARATUS, AND METHOD

CROSS-REFERENCE TO RELATED APPLICATIONS

This application claims priority of EP application 20178213.3 which was filed on Jun. 4, 2020 and which is incorporated herein in its entirety by reference.

FIELD

The present invention relates to a fluid purging system, projection system, illumination system, lithographic apparatus, and method.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as "Moore's law". To keep up with Moore's law the semiconductor industry is seeking technologies that make it possible to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

A lithographic apparatus may include an illumination system configured to condition a radiation beam before the radiation beam reaches the patterning device. Once the radiation beam has been patterned by the patterning device, a projection system directs the radiation beam to the substrate. The illumination system and the projection system comprise optical elements. Contamination of optical elements can lead to degradation in radiation beam uniformity, stray radiation being lost from the system or even reaching the substrate and resulting in errors, and/or can result in the contaminants reacting with a surface of the optical elements which can reduce the lifespan of the optical elements. Such optical elements may be situated within an ultra-clean fluid environment to prolong the lifetime of the optical elements of the projection system. The ultra-clean fluid environment may be termed a protective environment, or a micro-environment. This environment can reduce the optical element contamination (both cleanable and non-cleanable), thereby reducing the degradation in radiation beam uniformity, reducing the amount of stray radiation lost from the system and increasing lifespan of the optical element.

The fluid flow within the micro-environment can affect the purging performance. In conventional systems, the fluid may be provided to the micro-environment in such a way that stagnation points are generated in the fluid in the micro-environment. It is preferable to avoid such stagnation points because these are zones in which the fluid is not moving and thus, purging is not effectively carried out. Back-flow may also occur in conventional systems where fluid containing contaminants reverses direction.

The system of the present invention provides fluid flow over the optical element which may improve purging performance on the surface of the optical element, for example, by reducing or avoiding stagnation points in the fluid flow over the optical element and/or back-flow of contamination.

SUMMARY

An object of the present invention is to provide a fluid purging system for providing fluid to an optical element from outside of the micro-environment to provide improved purging of the optical element.

In the present invention, there is provided a fluid purging system a fluid purging system for an optical element, comprising: a ring formed of a body entirely surrounding the optical element, the ring defining a space radially inwards thereof and adjacent to the optical element, the ring formed by at least one first wall portion and at least one second wall portion, wherein an average height of the first wall portion is greater than an average height of the second wall portion; a fluid supply system positioned radially outwards of the ring and configured to supply fluid to pass over the at least one second wall portion to the space.

In the present invention, there is provided an illumination system comprising the fluid purging system.

In the present invention, there is also provided a projection system comprising the fluid purging system.

In the present invention, there is also provided a lithographic apparatus comprising the fluid purging system.

In the present invention, there is also provided a method of manufacturing a device using said lithographic apparatus.

Further embodiments, features and advantages of the present invention, as well as the structure and operation of the various embodiments, features and advantages of the present invention, are described in detail below with reference to the accompanying drawings.

BRIEF DESCRIPTION OF THE DRAWINGS

Embodiments of the invention will now be described, by way of example only, with reference to the accompanying schematic drawings in which corresponding reference symbols indicate corresponding parts, and in which.

The features shown in the figures are not necessarily to scale, and the size and/or arrangement depicted is not limiting. It will be understood that the figures include optional features which may not be essential to the invention. Furthermore, not all of the features of the system and/or lithographic apparatus are depicted in each of the figures, and the figures may only show some of the components relevant for a describing a particular feature.

DETAILED DESCRIPTION

In the present document, the terms "radiation" and "beam" are used to encompass all types of electromagnetic radiation, including ultraviolet radiation (e.g. with a wavelength of 436, 405, 365, 248, 193, 157, 126 or 13.5 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
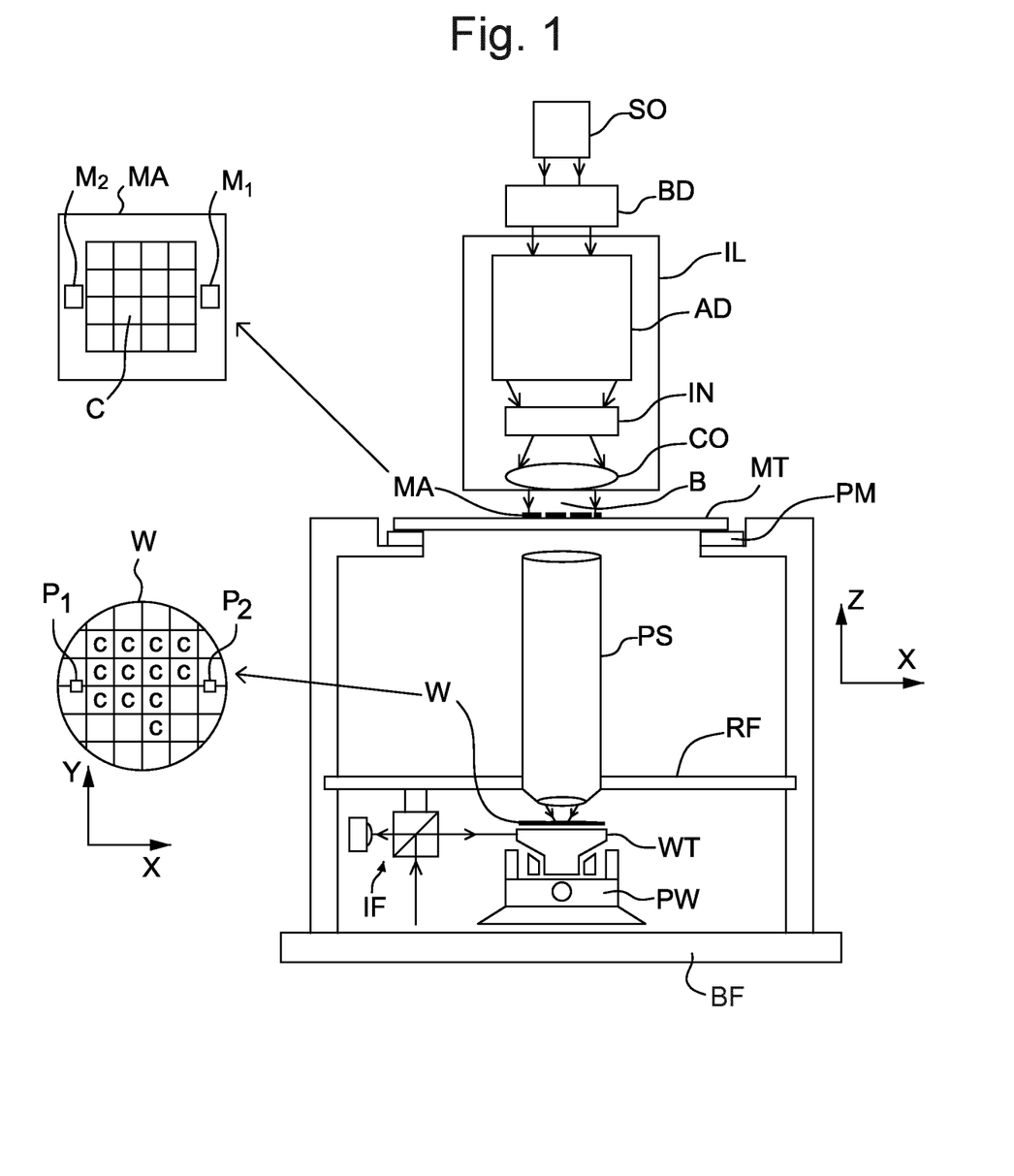
FIG. 1 schematically depicts an overview of a lithographic apparatus.

FIG. 1 schematically depicts a lithographic apparatus. The lithographic apparatus includes an illumination system (also referred to as illuminator) IL configured to condition a radiation beam B (e.g., EUV radiation or DUV radiation), a mask support (e.g., a mask table) MT constructed to support a patterning device (e.g., a mask) MA and connected to a first positioner PM configured to accurately position the patterning device MA in accordance with certain parameters, a substrate table WT constructed to hold a substrate (e.g., a resist coated wafer) W and connected to a second positioner PW configured to accurately position the substrate table WT in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate W may be covered by an immersion liquid having a relatively high refractive index, e.g., water, so as to fill an immersion space between the projection system PS and the substrate W—which is also referred to as immersion lithography. More information on immersion techniques is given in U.S. Pat. No. 6,952,253, which is incorporated herein by reference.

The lithographic apparatus may be of a type having two or more substrate tables WT (also named "dual stage"). In such "multiple stage" machine, the substrate tables WT may be used in parallel, and/or steps in preparation of a subsequent exposure of the substrate W may be carried out on the substrate W located on one of the substrate table WT while another substrate W on the other substrate table WT is being used for exposing a pattern on the other substrate W.

In addition to the substrate table WT, the lithographic apparatus may comprise a measurement stage (not depicted in FIG. 1). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate table WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system PMS, the substrate table WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

In this specification, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

It has been identified that optical performance of known systems may suffer from contamination of optical elements which may occur due to sub-optimal purging performance. In general, lens contamination scales linearly with the amount of certain types of light and thus, any increase in throughput of the lithographic apparatus is likely to lead to an increase in lens contamination and thus, leads to more deterioration in optical performance. This would likely result in certain optical elements needing to be replaced earlier as the lifetime of the optical element might be reduced, or cleaned more frequently which can disrupt performance of the apparatus.

Thus, it is beneficial to protect optical elements in a lithographic apparatus, such as lenses, from contamination. A known way of protecting such optical elements is to place the optical element in a semi-closed environment (which may otherwise be referred to as a purging volume, protective environment, a micro-environment or a mini-environment). The semi-closed environment may be purged with clean fluid (e.g. clean gas) so that containments on or around the optical element surface can be removed, or at least reduced to a level which allows an improved lifetime of the optical element. Thus the lifetime of an optical element may be dependent on the performance of the purging of the semi-closed environment.

For some systems, the purging performance (and thus, the lifetime of the optical element) depends on many factors, such as refreshment rate, overpressure with respect to outside environment, and purging uniformity.

The refreshment rate is related to purge flow velocity and the purging lengths. Generally, the higher the refreshment rate, the shorter the amount of time contamination remains on the optical element and thus, the shorter the amount of time any contamination has to react with the surface of the optical element which results in a lower contamination rate.

The pressure of the semi-closed environment is related to how closed the environment is, which will depend on the elements which define the semi-closed environment. The average pressure of the purging volume in the semi-closed environment should generally be higher than outside the environment because this leads to an outflow of the purging fluid. This reduces the risk of back-flow of the purging fluid and thus, reduces the risk of back-flow of contaminants in the purging fluid.

It is beneficial that the purge flow is uniformly-distributed along the optical element because this can reduce or avoid stagnation points, recirculation of flow (which might contain contaminants) or turbulence of the purging fluid.

As described below, the present invention relates to a fluid purging system in which fluid is supplied outside of an semi-closed environment. This means that the purging fluid needs to travel through a small intermediate volume (which is part of an outside environment) and needs to cross a boundary of the semi-closed environment. Generally the boundary of the semi-closed environment is flow-restricted which may negatively affect purging performance. Despite this, providing purging fluid outside of the semi-closed environment has various advantages which means that it is an attractive option despite such potential issues. In particular, providing purging fluid outside of the semi-closed environment as described below results in an easy system function breakdown and integration. Furthermore, there is often an issue in conventional systems in finding space to integrate purging hardware close to an area where it matters most, such as an optical element. Providing purging fluid outside of the semi-closed environment provides improved flexibility in resolving such a volume conflict, because it uses available space outside of the optical element/semi-closed environment.

In some known systems, a fluid purging system is provided for an optical element, e.g., a lens, and it is equipped with gas inlets which are outside of the semi-closed environment, in other words the gas inlets are not in direct contact with the semi-closed environment. The semi-closed environment may otherwise be referred to as a purging volume. In such a known system, the semi-closed environment for the optical element which is purged is defined by a ring as a boundary to the semi-closed environment. Purge gas inlets, also known as a purge box, are mounted radially outwards of the semi-closed environment. As described above, a problem with such known purging systems is that the purging gas might have difficulty crossing the flow-restrictive boundary provided by the ring, which might lead to sub-optimal purging performance.

The ring at the edge of the semi-closed environment can restrict fluid flow into the semi-closed environment in order to maintain sufficient overpressure of the semi-closed environment (i.e. the purged volume) with respect to the environment outside the ring. As described above, this is beneficial for suppressing back-flow and/or back-diffused contamination. However, although there are benefits to the ring providing such high-flow restriction, such a flow-restrictive boundary blocks the purge fluid from entering the semi-closed environment. This can lead to low purge flow velocity and thus, low refreshment rate in the purge volume which should ideally be increased as described above.

Thus, it could be beneficial to reduce the flow restriction provided by the ring, for example, by reducing the height of the ring. The height of the ring may be considered to be the extent of the protrusion of the ring from the surface surrounding the optical element. Although a reduction in the height of the ring may make the boundary of the semi-closed environment less restrictive in order to increase the refreshment rate, this may negatively affect the overpressure. Removal of the ring would also negatively affect the overpressure, even if it did result in an improvement in the refreshment rate.

Furthermore, the ring provides mechanical advantages as it can be used as a mechanical safety guard for the optical element. In particular, the ring can protect the optical element during transportation and installation due to the height of the ring surrounding the optical element forming a physical barrier. This means that reducing the height of the ring may reduce the effectiveness of the ring in providing such protection.

It is noted that a surface opposite the ring could be moved closer to, or further away from, the ring in order to vary the amount of fluid which might pass into the semi-closed environment. However, any variation in the distance between the optical element and such an opposing surface could risk optical performance.

In the present invention, there is provided a fluid purging system which will be described in detail below. The fluid purging system in the present invention may address some of the issues that are identified above.

Figure 2A:
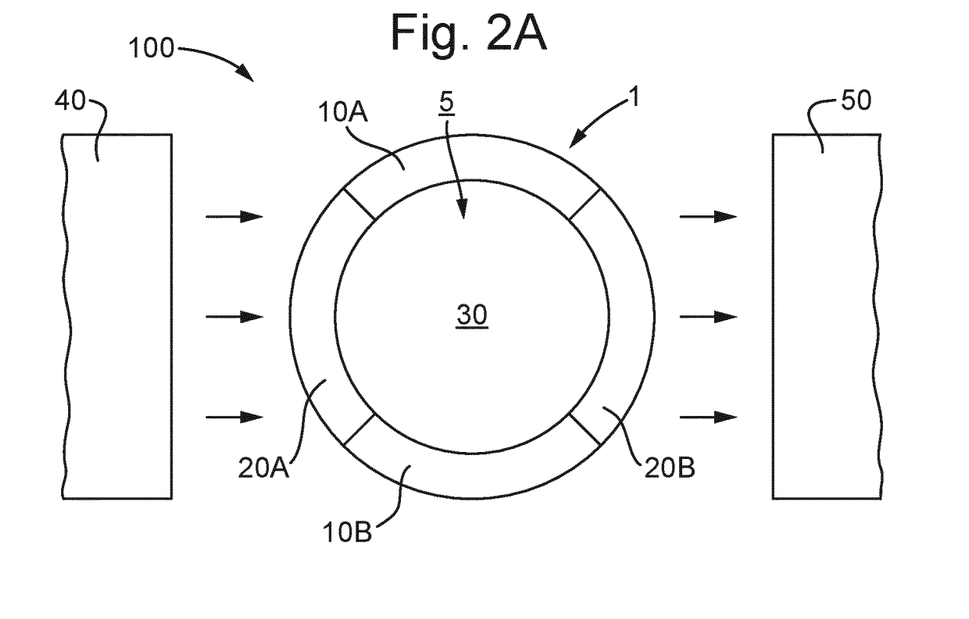
FIGS. 2A, 2B and 2C depict a fluid purging system according to an embodiment.
Figure 2B:
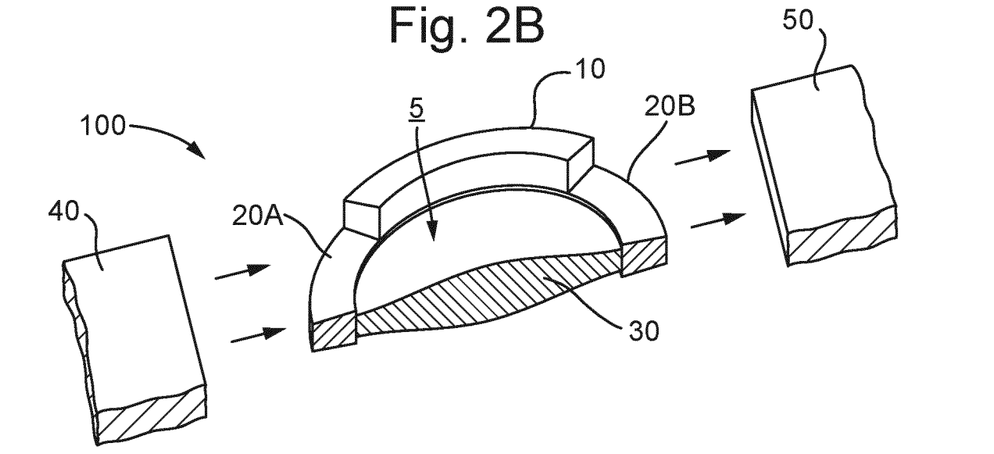

The fluid purging system of the present invention may be provided, for example, as shown in FIGS. 2A and 2B. FIG. 2A shows the fluid purging system 100 and FIG. 2B shows a cross-section of the fluid purging system 100.

The fluid purging system 100 is suitable for use with a lens 30. Thus, the fluid purging system 100 can be used to provide purging fluid to the lens 30. Although lens 30 is referred to below and is shown in the corresponding figures, the lens 30 is representative of an optical element and could be replaced with any appropriate optical element, including any refractive and reflective optical components. The optical element may comprise the lens 30 and/or may comprise another optical element, such as the projection lens, or illumination optics. The lens 30 is shown as having a convex shape, the lens 30 may instead have a concave shape.

The fluid purging system 100 comprises a ring 1. The ring 1 entirely surrounds the lens 30. The lens 30 is radially inwards of the ring 1. The ring 1 may entirely surround the lens 30 in a cross-sectional plane through the ring 1. In other words, the ring 1 encloses the lens 30. The ring 1 encloses the lens 30 in that it surrounds the lens 30 without any gaps in the ring 1. The ring 1 entirely surrounding the lens 30 means that at least part of the ring 1 is formed radially outwards of the lens 30. Thus, the ring 1 may be formed around the outside of the lens 30. The ring 1 may contact at least a part of an outer edge of the lens 30. The ring 1 may be positioned on and around the outside of the outer edge of the lens 30. The ring 1 may be in direct contact with the lens 30, i.e., there is no gap between a surface of the ring 1 and the lens 30.

The ring 1 may be formed of a body entirely surrounding the lens 30 as described above. In other words, the ring 1 is formed as a single body which entirely surrounds the lens 30. In other words, the ring 1 forms a continuous boundary around the outside of the lens 30. The ring 1 may be formed as a circle, or oval shape. However, other shapes might be used depending on the shape of the lens 30, i.e., the shape of the ring 1 may conform to the shape of the lens 30.

The ring 1 defines a space 5 radially inwards thereof. Thus, the ring 1 may form a continuous boundary around the outside of the space 5. The space 5 is a volume radially inwards of the ring 1. The ring 1 may entirely surround the space 5 in a cross-sectional plane through the ring 1. In other words, the ring 1 may form a continuous boundary outside of the space 5. In other words, the ring 1 is formed as a single body which may entirely surround the space 5. The lens 30 is adjacent to the space 5. In other words, the lens 30 may be positioned at a boundary of the space 5. The lens 30 may protrude into the space 5. For example, the lens 30 as shown in FIG. 2B is positioned inside of the ring 1 and protrudes from a base of the ring 1. As shown in FIG. 2B, the centre of the lens 30 bulges inwards into the space 5, due to the convex shape of the lens 30. As described above, the lens 30 may be concave, in which case, an outside edge of the lens 30 may protrude into the space 5. The ring 1 and the lens 30 may define the space, i.e. the boundaries of the space 5 may be formed at least partially by the ring 1 and at least partially by the lens 30, e.g., the space 5 may be defined by the inner surface of the ring 1 and a surface of the lens 30. The lens 30 may be part of the fluid purging system 100.

The space 5 may correspond to, or form at least part of, the purging volume described above. Thus, the space 5 may correspond to, or form at least part of, the semi-closed environment, micro-environment, protective environment, or mini-environment referred to above.

Figure 2C:
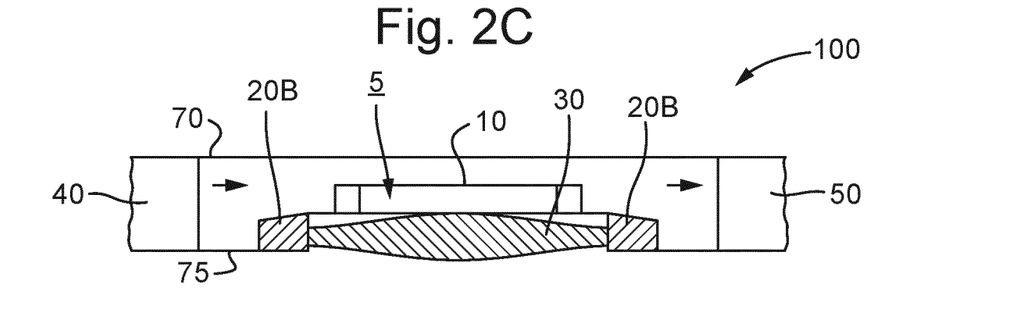

The ring 1 is formed by at least one first wall portion 10 and at least one second wall portion 20. The at least one first wall portion 10 may otherwise be referred to as a merlon. The at least one second wall portion 20 may otherwise be referred to as a crenel. An average height of the first wall portion 10 is greater than an average height of the second wall portion 20. More generally, the ring 1 may be formed as a boundary with at least one first wall portion and at least one second wall portion with different heights from each other. The average height of the first wall portion 10 and/or the second wall portion 20 may be determined using the same method or calculation. For example, the average height might be determined by determining the volume of one of the wall portions divided by the cross-sectional area. The average height of the first wall portion 10 may be determined by the average height of the first wall portion 10 at an edge of the ring 1 adjacent to the lens 30, i.e. an average height of an inner edge of the first wall portion 10. Similarly, the average height of the second wall portion 20 may be determined by the average height of the second wall portion 20 at an edge of the ring 1 adjacent to the lens 30, i.e. an average height of an inner edge of the second wall portion 20. As the first wall portion 10 has a greater average height than the second wall portion 20, the first wall portion 10 protrudes more than the second wall portion 20. Thus, the first wall portion 10 may protrude more over a given area from the base of the ring 1 than the second wall portion 20 protrudes over a given area from the base of the ring 1. In practice, when in use, the ring 1 may be positioned on a surface 75, as shown in FIG. 2C, the first wall portion 10 protrudes more from the surface 75 than the second wall portion 20. The average height of the first wall portion 10 and the average height of the second wall portion 20 may be determined relative to the lens 30, for example, relative to a point of contact between the lens 30 and the ring 1.

The fluid purging system 100 comprises a fluid supply system 40. The fluid supply system 40 is positioned radially outwards of the ring 1. Thus, the fluid supply system 40 is provided outside of the ring 1. Thus, the fluid supply system 40 may correspond to the purge gas inlets described above which are positioned outside of the semi-closed environment. The fluid supply system 40 is configured to supply fluid to pass over the at least one second wall portion 20 to the space 5. The fluid being provided to the space 5 means that the fluid is provided to pass over the ring 1 and over the surface of the lens 30 which is in or adjacent to the space 5. Thus, the fluid supply system 40 is configured to provide fluid to the surface of the lens 30 adjacent to the space 5. The fluid supply system 40 is configured to provide fluid radially inwards of the ring 1.

The fluid may be any appropriate fluid. The fluid may be gas, e.g., $N_2$, He, Ar, Kr, Ne, Xe, Air, CDA and XCDA. In this case, reference to the fluid may be replaced with gas. In this case, the fluid purging system 100 may be a gas purging system, and the fluid supply system 40 may be a gas supply system. The fluid may be clean gas. The fluid may be liquid, e.g. ultraclean water.

The fluid purging system 100 as in the present invention may be beneficial in more easily allowing fluid to pass to and from the space 5 and thus, can improve refreshment rate of purging fluid on the lens 30. This is due to the ring 1 having at least one first wall portion 10 and at least one second wall portion 20, wherein the first wall portion 10 has a greater average height than the second wall portion 20, and the fluid supply system 40 being configured to provide fluid to the space 5 as described.

The at least one first wall portion 10 may be configured to restrict flow into or out of the space 5. In other words, the at least one first wall portion 10 can reduce fluid flow from outside the ring 1 to the space 5 and/or from the space 5 to outside of the ring 1. Thus, the at least one first wall portion 10 can serve as a highly restrictive flow barrier. This is beneficial in providing sufficient over pressure in the space 5 with respect to the environment outside the ring 1. Preferably, the height of the first wall portion 10 is as high as possible (taking into account the position of the ring 1 and other components), so that inflow over the first wall portion 10 can be reduced or minimised. For example, the at least one first wall portion 10 may be at least approximately 5 mm from the base of the ring 1, or preferably, at least approximately 6 mm from the base of the ring 1, or preferably, at least approximately 7 mm, or preferably, at least approximately 8 mm, or preferably, at least approximately 9 mm, or preferably, at least approximately 10 mm, or preferably, at least approximately 11 mm, or preferably, at least approximately 12 mm, or preferably, at least approximately 15 mm, or preferably, at least approximately 20 mm, or preferably, at least approximately 30 mm, or preferably, at least approximately 40 mm. This may refer to the average height of the at least one first wall portion 10, e.g. over the whole area of the first wall portion 10 or at an inner edge of the first wall portion 10, or the highest point of the at least one first wall portion 10. The at least one second wall portion 20 may be at least approximately 2 mm from the base of the ring 1, or preferably, at least approximately 3 mm, or preferably, at least approximately 4 mm, or preferably, at least approximately 5 mm, or preferably, at least approximately 6 mm, or preferably, at least approximately 7 mm, or preferably, at least approximately 8 mm, or preferably, at least approximately 9 mm, or preferably, at least approximately 10 mm, or preferably, at least approximately 15 mm, or preferably, at least approximately 20 mm, or preferably, at least approximately 25 mm, or preferably, at least approximately 30 mm. This may refer to the average height of the at least one second wall portion 20, e.g. over the whole area of the second wall portion 20 or at an inner edge of the second wall portion 20, and/or the highest point of the at least one second wall portion 20.

The average height of the at least one first wall portion 10 is greater than the average height of the at least one second wall portion 20, and may be up to around four times greater than the average height of the at least one second wall portion 20. The ratio of the average height of the at least one first wall portion 10 to the average height of the at least one second wall portion is greater than 1:1, or preferably greater than or equal to approximately 2:1, or preferably greater than or equal to approximately 3:1, or preferably greater than or equal to approximately 4:1. It will be noted that these are example values only, because the appropriate size and height of the first wall portion 10 and the second wall portion 20, and also the ratio of the heights of these walls, will depend on how each ring 1 is to be used.

As the difference in average height of the first wall portion 10 and the second wall portion 20 results in a difference in height around the space 5, the difference in height between the first wall portion 10 and the second wall portion 20 may have greater effect on controlling the fluid flow than the overall average height of the first wall portion 10 and the second wall portion 20 relative to the base of the ring 1. The difference in height between the first wall portion 10 and the second wall portion 20 may be at least approximately 2 mm, or preferably, at least approximately 3 mm, or preferably, at least approximately 4 mm, or preferably, at least approximately 5 mm, or preferably, at least approximately 6 mm, or preferably, at least approximately 7 mm, or preferably, at least approximately 8 mm, or preferably, at least approximately 9 mm, or preferably, at least approximately 10 mm, or preferably, at least approximately 11 mm, or preferably, at least approximately 12 mm, or preferably, at least approximately 15 mm, or preferably, at least approximately 20 mm, or preferably, at least approximately 25 mm, or preferably, at least approximately 30 mm.

The at least one first wall portion 10 is also beneficial in that it can provide a physical barrier around the lens 30. Thus, the at least one first wall portion 10 can provide a mechanical safety guard of the optical element, e.g., lens 30, as described above, particularly during installation and transportation. For example, during transportation of lens 30, a mechanical cover might be placed on top of the lens 30 for protection purposed. The mechanical cover may use a supporting feature with sufficient height between the lens 30 and the cover. The at least one first wall portion 10 can serve as such a mechanical supporting feature to support such a mechanical cover.

The at least one second wall portion 20 can serve as a low restrictive flow inlet to the space 5. This is more beneficial in more easily allowing fluid flow into the space 5. The at least one second wall portion 20 can serve as a low restrictive flow outlet from the space 5. This is beneficial in more easily allowing fluid flow out of the space 5, particularly, in a defined and controlled way and at a predetermined position. At least one second wall portion 20 may serve as a low restrictive flow inlet to the space 5 and at least one second wall portion may serve as a low restrictive flow outlet from the space 5. This is beneficial in more easily allowing fluid to pass to and from the space 5 and thus, can improve refreshment rate of the purging fluid on the lens 30.

Preferably, the fluid supply system 40 and the ring 1 are arranged such that a majority of the fluid from the fluid supply system 40 passes radially inwards of the ring 1 and the rest of the fluid from the fluid supply system 40 flows around an outer periphery of the ring 1. This is beneficial in that the flow around the outer periphery reduces, or prevents, fluid from outside the fluid purging system 100 from being entrained with the fluid flowing into the space 5 in the ring 1. This reduces or prevents the possibility of contamination from outside of the ring 1 being moved inside the ring 1 by the fluid. Additionally, contamination can be removed from just outside the ring 1 and may be moved away from the lens 30. The arrangement of the fluid supply system 40 and the ring 1 may be configured to have the fluid supply system 40 aligned with at least one second wall portion 20. In other words, the fluid supply system 40 may be positioned to provide fluid towards to the space 5 across the at least one second wall portion 20. This may be beneficial in that most of the fluid can pass over the lower part of the ring 1, i.e. over the at least one second wall portion 20 to pass radially inwards of the ring 1 to the space 5. The fluid provided by the fluid supply system 40 may be provided in a fluid stream and the fluid stream may be wider than the at least second wall portion 20 at the point of entry across the ring 1. For example, the fluid supply system 40 may have a length across which the fluid is provided, wherein the length is greater than a width of at least one second wall portion 20. In this case, a majority of the fluid from the fluid supply system 40 would be directed inwards of the ring 1. Some of the fluid may be redirected around the outer periphery of the ring 1 by a higher part of the ring 1 at an edge of the second wall portion 20, i.e. the first wall portion 10. Additionally or alternatively, the fluid supply system 40 may supply the fluid stream such that the fluid stream spreads outwards as it approaches the ring 1 and thus, at least some of the fluid steam may flow around the outer periphery of the ring 1.

The fluid purging system 100 may be configured such that the space 5 is maintained at a pressure larger than a pressure outside of the space 5. The pressure of the space 5 may be controlled by the fluid provided by the fluid supply system 40 to the space 5 and due to the shape of the ring 1 as described in relation to the present invention. It is beneficial that the higher pressure of the fluid over the lens 30 is provided at the same time as a higher refreshment rate. It is particularly beneficial to increase and/or optimise the fluid flow velocity in the middle of the lens 30, i.e. towards the centre of the lens 30 which may correspond to the exposure slit, because this is a critical area of the lens 30 through which radiation may pass in a lithographic apparatus. In known systems, the effectiveness of the purging fluid is lower in the middle of the lens 30 due to the geometric nature of the lens 30 and thus, the fluid purging system 100 of the present invention may be particularly beneficial in improving the gas flow velocity in the middle of the lens 30.

Due to the overpressure in the space 5, a small outflow may be present over the two first wall portions 10A, 10B. Preferably, the at least two first wall portions 10A, 10B are configured such that the amount of fluid flowing over the two first wall portions 10A, 10B is less than that flowing over the at least one second wall portion 20. Thus, the first wall portions 10A, 10B provide greater flow restriction that the second wall portion 20 such that more fluid flows over one second wall portion 20 than two first wall portions 10A,

10B. Preferably, the fluid flow over the two first wall portions 10A, 10B is significantly less that the fluid flow over the second wall portion 20.

Preferably, the fluid supply system 40 is configured to supply fluid at a rate of approximately 20 nlpm (normal litres per minute) to 150 nlpm, or preferable from approximately 70 nlpm to approximately 110 nlpm. The fluid supply system 40 may provide the fluid at any appropriate rate. Preferably, the fluid supply system 40 is configured to supply fluid at a rate of approximately greater than or equal to 20 nlpm, or preferably, approximately greater than or equal to 45 nlpm, or preferably, approximately greater than or equal to 70 nlpm, or preferably, approximately greater than or equal to 90 nlpm. Preferably, the fluid supply system 40 is configured to supply fluid at a rate of approximately less than or equal to 150 nlpm, or preferably approximately less than or equal to 110 nlpm, or preferably, approximately less than or equal to 90 nlpm. These fluid flow rates may be used for any appropriate fluid, but particularly for one of the gases described above, e.g., $N_2$, He, Ar, Kr, Ne, Xe, Air, CDA and XCDA, and the fluid flow referred to here in normal litres per minute (nlpm) is assumed to be provided at 0° C. and 1 atmosphere. Of course, the fluid may be provided at any other appropriate temperature and/or pressure.

The fluid purging system 100 may further comprise a fluid extraction system 50. The fluid extraction system 50 is depicted in FIGS. 2A and 2B. The fluid extraction system 50 may be configured to extract the fluid from the space 5. The fluid extraction system 50 may be configured to extract fluid from the space 5 at the same, or a similar, rate as the fluid supply system 40 supplies fluid to the space 5. The fluid extraction system 50 may be positioned on an opposite side of the ring 1 to the fluid supply system 40. The fluid extraction system 50 and the fluid supply system 40 may be positioned to be symmetrical around a centre of the ring 1. Although the fluid extraction system 50 is shown in FIGS. 2A and 2B, the fluid extraction system 50 is optional, and the other features shown and described in relation to these figures may be provided without the fluid extraction system 50.

Figure 3:
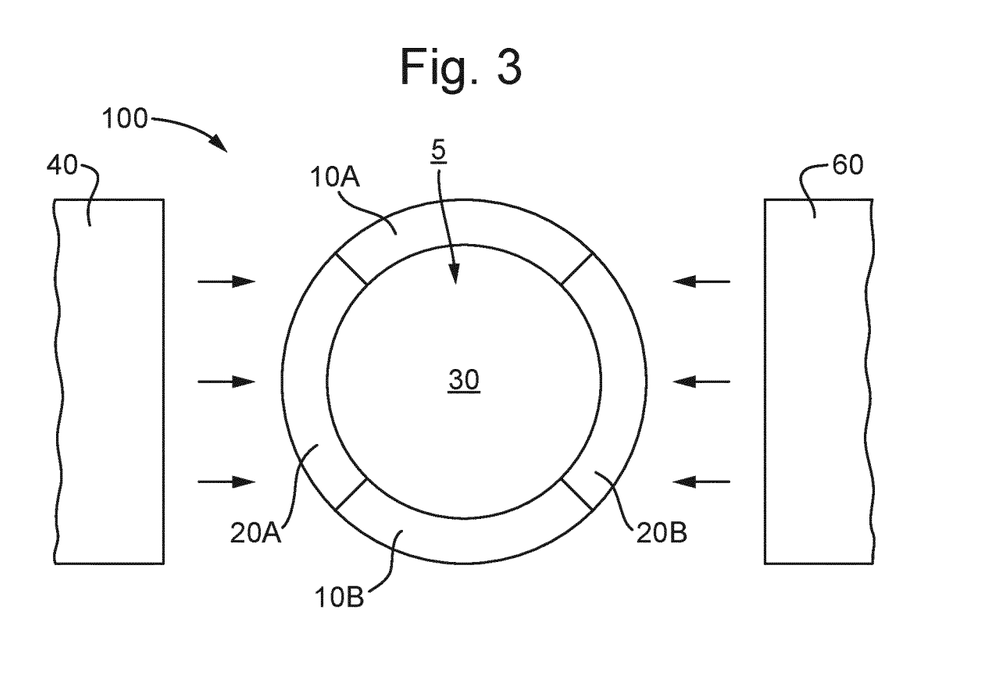
FIG. 3 depicts a variation of the fluid purging system according to an embodiment.

The ring 1 comprises at least one first wall portion 10 and at least one second wall portion 20. Thus, the ring 1 may comprise only one first wall portion 10, or multiple first wall portions 10. The multiple first wall portions 10 may all have the same height as each other. The ring 1 may have only one second wall portion 20, or multiple second wall portions 20. The multiple second wall portions 20 may all have the same height as each other. As shown in FIG. 2A, the ring 1 may be formed by two first wall portions 10A, 10B and two second wall portions 20A, 20B. Preferably, the ring 1 comprises two or more first wall portions 10. Preferably, the ring 1 comprises two or more second wall portions 20. In an embodiment as shown in FIGS. 2A and 3, the two first wall portions 10A, 10B and the two second wall portions 20A, 20B may be arranged alternately along a circumference of the ring 1.

Preferably, the two first wall portions 10A, 10B are provided on opposite sides of the ring 1 to each other. This is shown in FIGS. 2A and 3 in which one of the first wall portions 10A is opposite the other first wall portion 10B. Preferably, the two second wall portions 20A, 20B are provided on opposite sides of the ring 1 to each other. This is shown in FIGS. 2A and 3 in which one of the second wall portions 20A is opposite the other second wall portion 20B.

Preferably, one of the second wall portions 20 is aligned with the fluid supply system 40 to provide a fluid inlet to the space 5. This is shown in FIGS. 2A and 2B in which the fluid supply system 40 is provided in such a way that fluid from the fluid supply system 40 is directed towards one of the at least two wall portions 20A. More generally, the locations of at least one second wall portion 20 may be aligned with a fluid inlet so as to minimize the hydraulic resistance to the flow from the fluid supply system 40 to the lens 30. This should enhance fluid flow velocity and refreshment rate in the space 5. Multiple second wall portions 20 may be used as a fluid inlet.

Preferably, one of the second wall portions 20 provides a fluid outlet from the space 5. This can be seen in FIGS. 2A and 2B in which the other second wall portions 20B allows fluid to move from the space 5 to an environment outside of the ring 1. The locations of at least one of the second wall portions 20, which may act as a fluid outlet from the space 5, can be chosen to guide the fluid flow inside the space 5. When a fluid flow pattern with minimal purge length is desired (e.g. to achieve an increased, or optimal, refreshment rate), at least one of the second wall portions 20 which acts as an outlet can be aligned with the expected direction of flow across the space 5, e.g. depending on the flow at the inlet to the space 5. If the overall hydraulic resistance of the space 5 is too high, this can lead to low fluid velocity and low refreshment rate in the space 5. The at least one second wall portion 20 acting as a fluid outlet may be beneficial in that it can provide a low-restrictive outlet. This is also beneficial in reducing or avoiding flow stagnation points in the fluid flow in the space 5. Multiple second wall portions 20 may be used as a fluid outlet.

Using at least one of the second wall portions 20 as a fluid inlet and at least one of the second wall portions 20 as a fluid outlet is beneficial in that the overall hydraulic resistance of the space 5 may be sufficiently low for securing high flow velocity and refreshment rate in the space 5. In particular, providing two second wall portions 20 with one second wall portion 20A as a fluid inlet and one second wall portion 20B as a fluid outlet as shown in FIGS. 2A and 2B may be particularly beneficial because it may result in any stagnation zones over the lens 30 being formed away from the middle of the lens (i.e. away from the exposure slit), which may therefore, reduce the negative impact of such stagnation zones.

The fluid purging system 100 may comprise a further surface 70 opposite the ring 1. In other words, the further surface 70 may be facing the lens 30. The fluid may thus pass between the further surface 70 and the lens 30. In other words, restriction to the fluid flow over the lens 30 can be provided by the ring 1 and the further surface 70. Thus, the boundaries of the space 5 may be at least partially defined by the ring 1 and the further surface 70. The further surface 70 is shown in FIG. 2C. As described above, the further surface 70 opposite the ring 1 and the lens 30 could be moved closer to, or further away from, the ring 1 in order to vary the amount of fluid which might pass into the semi-closed environment. The further surface 70 may be a surface of another optical element, such as a lens, through which radiation may pass. As shown, the fluid purging system 100 may comprise the surface 75, for example, on which the ring 1 can be positioned. The further surface 70 may be facing, i.e. opposite, the surface 75. Any or all of the fluid supply system 40, further fluid supply system 60 and/or fluid extraction system 50 may be positioned on the surface 75.

Figure 4:
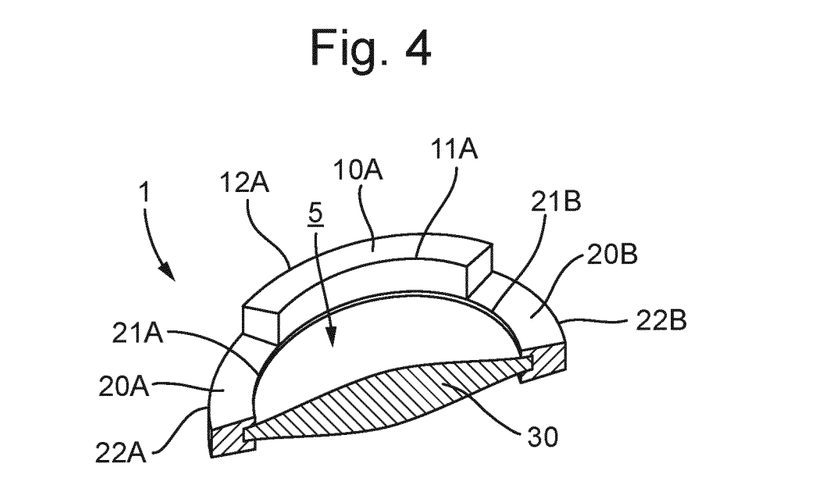
FIG. 4 depicts a more detailed version of FIG. 2A.

The ring 1 may be provided surrounding the lens 30 in any appropriate configuration. For example, the lens 30 may be positioned within an inner surface of the ring 1, as shown in FIGS. 2B and 2C. For example, the lens 30 may be positioned to sit within a recess on the inner surface of the ring 1, as shown in FIG. 4. Any appropriate way of providing the ring 1 around the lens 30 may be used. The variation shown in FIGS. 2B and 2C may be used in combination with any of the variations shown or described in relation to the other Figures. The variation shown in FIG. 4 may be used in combination with any of the variations shown or described in relation to the other Figures.

In the above variations, the fluid purging system 100 is provided with a fluid supply system 40 and a fluid extraction system 50. However, the fluid purging system 100 may be provided with a fluid supply system 40 without a fluid extraction system 50. Additionally or alternatively, the fluid purging system 100 may comprise a further fluid supply system 60. This is shown in FIG. 3. The further fluid supply system 60 may be positioned radially outwards of the ring 1. The fluid supply system 40 may be configured to supply fluid to pass over one of the at least two second wall portions 20A into the space 5. The further fluid supply system 60 may be configured to supply fluid to pass over the other of at least two second wall portions 20B into the space 5.

The further fluid supply system 60 may be configured to provide fluid at a rate of approximately 20 nlpm to 150 nlpm, or preferable from approximately 70 nlpm to approximately 110 nlpm. The further fluid supply system 60 may provide the fluid at any appropriate rate. Preferably, the further fluid supply system 60 is configured to supply fluid at a rate of approximately greater than or equal to 20 nlpm, or preferably, approximately greater than or equal to 45 nlpm, or preferably, approximately greater than or equal to 70 nlpm, or preferably, approximately greater than or equal to 90 nlpm. Preferably, the further fluid supply system 60 is configured to supply fluid at a rate of approximately less than or equal to 150 nlpm, or preferably, approximately less than or equal to 110 nlpm, or preferably, approximately less than or equal to 90 nlpm. These fluid flow rates may be used for any appropriate fluid, but particularly for one of the gases described above, e.g., $N_2$, He, Ar, Kr, Ne, Xe, Air, CDA and XCDA, and the fluid flow referred to here in normal litres per minute (nlpm) is assumed to be provided at 0° C. and 1 atmosphere. Of course, the fluid may be provided at any other appropriate temperature and/or pressure.

Although providing a fluid supply system 40 and a further fluid supply system 60 may be beneficial, there is also a risk that multiple fluid streams into the space 5 may introduce flow stagnation points in the middle of the space 5, i.e. in areas which may be of particular importance for lens performance. Such flow stagnations may be reduced or controlled by selecting the position of the at least one first wall portion 10 around the ring 1, the position of at least one second wall portion 20 around the ring 1, the position of the fluid supply system 40 relative to the ring 1, and the position of the further fluid supply system 60 relative to the ring 1.

In a preferred embodiment, the fluid purging system 100 is provided with only the fluid supply system 40 (i.e. without the further fluid supply system 60 and without the fluid extraction system 50). This may be beneficial in reducing stagnation points over the lens 30, and particularly in the middle of the lens 30 (because this is a critical area of the lens 30 through which radiation may pass in a lithographic apparatus).

FIG. 4 shows a more detailed view of the ring 1 as in FIGS. 2A and 2B. Additional details of the at least one first wall portion 10 and the at least second wall portion 20 can be more clearly distinguished in FIG. 4.

A height of the at least one first wall portion 10 may vary in a radial direction. In other words, the height of the at least one first wall portion 10 changes from an inside of the ring 1 to an outside of the ring 1. The height may be varied with respect to a part of the ring 1 in contact with the lens 30. For example, an inner edge 11A of the at least one first wall portion 10A may be higher than an outer edge 12A of the at least one first wall portion 10A as shown in FIG. 4. Alternatively, an inner edge 11A of the at least one first wall portion 10A may be lower than an outer edge 12A of the at least one first wall portion 10A which may be beneficial in reducing unwanted fluid flow leaking inwards to the space 5.

A height of the at least one second wall portion 20 may vary in a radial direction. In other words, the height of the at least one second wall portion 20 changes from an inside of the ring 1 to an outside of the ring 1. The height may be varied with respect to a part of the ring 1 in contact with the lens 30. Preferably, the height of the at least one second wall portion 20 increases from the outer radius of the ring 1 to the inner radius of the ring 1. In other words, preferably, the at least one second wall portion 20 protrudes further from the base of the ring 1 at an inner side of the ring 1. In other words, an inner edge 21A, 21B of the at least one second wall portion 20A, 20B is higher than an outer edge 22A, 22B of the at least one second wall portion 20A, 20B.

Preferably, an edge of the at least one second wall portion 20 is rounded. For example, the inner edge 21A of one of the second wall portions 20A may be rounded. Additionally or alternatively, the inner edge 21B of the other of the at least one second wall portions 20B may be rounded. The outer edge 22A of one of the second wall portions 20A may be rounded. Additionally or alternatively, the outer edge 22B of the other of the at least one second wall portions 20B may be rounded. Providing the at least one second wall 20A, 20B with a rounded inner edge may be beneficial in reducing hydraulic resistance and reducing stagnation points of flow over the surface of the lens 30. Preferably, the inner edge 21A, 21B and outer edge 22A, 22B of at least one second wall portion 20A, 20B are rounded. Preferably, the inner edge 21A, 21B and outer edge 22A, 22B of all the second wall portions 20A, 20B are rounded. For example only, a radius of curvature for any edge described above which may be rounded may be from approximately 0.5 mm to approximately 4 mm.

Figure 5:
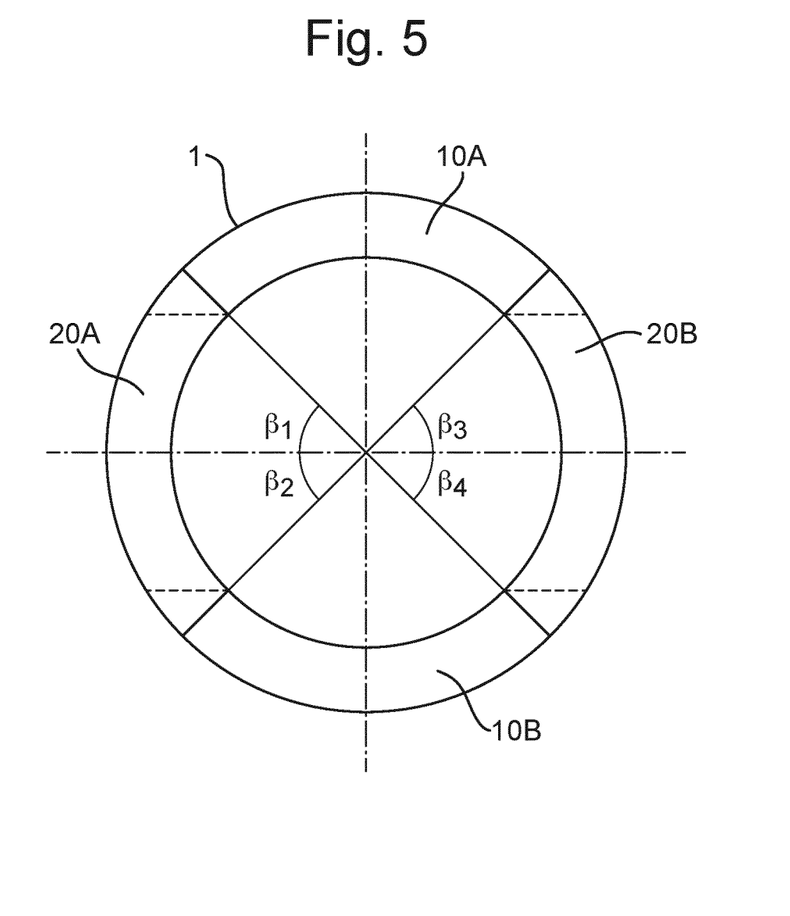
FIG. 5 depicts a variation of a ring of the fluid purging system.

The size of the at least one first wall portion 10A, 10B and the at least one second wall portion 20A, 20B may depend on how the flow is to be optimised over the lens 30. The size of the at least one first wall portion 10A, 10B and the at least one second wall portion 20A, 20B will depend on the radius of the ring 1 and the angle. The radius of the ring 1 will depend on the application and the size of the lens 30 (or other optical element), and may also depend on the fluid flow desired in the space 5. For example only, the radius of the ring 1 may be of the order of tens or hundreds of millimetres, although this is not a necessity. FIG. 5 depicts a simplified version of the ring 1 in FIGS. 2A-4. The angles $\beta_1$, $\beta_2$, $\beta_3$, and $\beta_4$ are representative of the size of the second wall portion 20A, 20B. As shown in FIG. 5, one of the second wall portions 20A may be formed with angles $\beta_1$ and $\beta_2$ and the other of the second wall portions 20B may be formed with angles $\beta_3$ and $\beta_4$. The angles $\beta_1$, $\beta_2$, $\beta_3$, and $\beta_4$ may be determined relative to a an axis through the centre of the ring 1. The axis is shown as a horizontal axis. Generally, each of the angles $\beta_1$, $\beta_2$, $\beta_3$, and $\beta_4$ as shown in FIG. 5 may be independent of each other. Each of the angles $\beta_1$, $\beta_2$, $\beta_3$, and $\beta_4$ may be between approximately 5° and 80°. Thus, at least one of the second wall portions 20A, 20B may form an angle from the centre of the ring 1 of approximately 10° to 160°. Thus, at least one of the first wall portions 10A, 10B may form an angle from the centre of the ring 1 of approximately 170° to 20°.

It is noted that edges at a transition between the at least one first wall portion 10A, 10B and the at least one second wall portions 20A, 20B as shown in the Figures are arranged in a radial direction. In other words, the edges between the at least one first wall portion 10A, 10B and the at least one second wall portions 20A, 20B form planes which pass through a central longitudinal axis of the ring 1. However, this is not a necessity. For example, the edges at the transition between the at least one first wall portion 10A, 10B and the at least one second wall portions 20A, 20B could be horizontal or vertical in any of FIG. 2A, 3 or 5. For example, providing horizontal edges between the wall portions, as indicated by the dashed edges shown in FIG. 5, would mean that the inlet and/or outlet may be more aligned with the fluid supply system 40 and/or the fluid extraction system 50 and/or the further fluid supply system 60. This may lead to a better flow profile of the fluid in the space 5.

Generally, in the above described embodiments, the ring 1 comprises two first wall portions 10A, 10B and two second wall portions 20A, 20B. However, other configurations are possible and the embodiment described in relation to figures might be provided with only one first wall portion 10 and only one second wall portion 20, or more than two first wall portions 10 and more than two second wall portions 20. For example, the ring 1 may have at least three, or four, or five, or six first wall portions 10. For example, the ring 1 may have at least three, or four, or five, or six second wall portions 20. The ring 1 may have the same number of first wall portions 10 and second wall portions 20.

Multiple first wall portions 10 may all have similar shape, and particularly, may be of the same height as each other. Multiple second wall portions 20 may all have a similar shape, and particularly, may be of the same height as each other. The ring 1 may comprise other wall portions, such as at least one third wall portion which has a height which differs from the height of the at least one first wall portion 10 and the height of the at least one second wall portion 20.

As the lens 30 is provided in or at an edge of the space 5, the shape of the surface of the lens 30 (e.g. depending on whether the lens 30 is concave or convex), may alter the fluid flow of the surface of the lens 30. Thus, the shape of the ring 1 described above is for example only as variations of the at least one first wall portion 10 and the at least one second wall portion 20 may be selected depending on the at least the shape of the lens 30 and the interaction of fluid passing across the lens 30 and the ring 1. For example, the size of the at least one first wall portion 10 and the at least one second wall portion 20 may be selected to best direct flow over the surface of a particular lens 30.

The fluid purging system 100 may be provided as part of various other systems. For example, the present invention may provide a projection system PS which may have components as described above, and the projection system PS may comprise the fluid purging system 100 described in any of the above embodiments or variations. The present invention may provide an illumination system IL which may have components as described above, and the illumination system IL may comprise the fluid purging system 100 described in any of the above embodiments or variations. The present invention may provide a lithographic apparatus which may have components as described above, and the lithographic apparatus may comprise the fluid purging system 100 described in any of the above embodiments or variations. The present invention may provide a method of manufacturing a device using said lithographic apparatus, wherein the fluid supply system 40 provides fluid to pass over the at least one second wall portion 20 of the ring 1 to the space 5.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

One or more embodiments of the invention may be applied to any dry lithography apparatus. One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a liquid handling structure) or an outlet out of the immersion space (or an inlet into the liquid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

While specific embodiments of the invention have been described above, it will be appreciated that the invention may be practiced otherwise than as described. Aspects of the invention are set out in the clauses below.

1. A fluid purging system for an optical element, comprising: a ring formed of a body entirely surrounding the optical element, the ring defining a space radially inwards thereof and adjacent to the optical element, the ring formed by at least one first wall portion and at least one second wall portion, wherein an average height of the first wall portion is greater than an average height of the second wall portion; a fluid supply system positioned radially outwards of the ring and configured to supply fluid to pass over the at least one second wall portion to the space.
2. The fluid purging system of clause 1, wherein the at least one first wall portion is configured to restrict flow into or out of the space.
3. The fluid purging system of clause 1 or 2, wherein the optical element comprises a lens.
4. The fluid purging system of any one of the preceding clauses, wherein the fluid supply system and the ring are arranged such that a majority of the fluid from the fluid supply system passes radially inwards of the ring, and the rest of the fluid from the fluid supply system flows around an outer periphery of the ring
5. The fluid purging system of any one of the preceding clauses, wherein the ring comprises at least two first wall portions and at least two second wall portions.
6. The fluid purging system of clause 5, wherein the two first wall portions are provided on opposite sides of the ring to each other, and the two second wall portions are provided on opposite sides of the ring to each other.
7. The fluid purging system of clause 5 or 6, wherein one of the at least two second wall portions is aligned with the fluid supply system to provide a fluid inlet to the space and the other of the at least two second wall portions provides a fluid outlet from the space.
8. The fluid purging system of clause 5 or 6, further comprising a further fluid supply system positioned radially outwards of the ring, wherein the fluid supply system is configured to supply fluid to pass over one of the at least two second wall portions into the space, and the further fluid supply system is configured to supply fluid to pass over the other of the at least two second wall portions into the space.
9. The fluid purging system of any one of clauses 5-7, further comprising a fluid extraction system configured to extract the fluid from the space.
10. The fluid purging system of any one of clauses 5-9, wherein the at least two first wall portions are configured such that the amount of fluid flowing over the two first wall portions is less than that flowing over the at least one second wall portion.
11. The fluid purging system of any one of the preceding clauses, configured such that the space is maintained at a pressure larger than a pressure outside of the space.
12. The fluid purging system of any one of the preceding clauses, wherein an edge of the at least one second wall portion is rounded.
13. The fluid purging system of any one of the preceding clauses, further comprising a surface opposite the ring, wherein the fluid in the space passes between the surface and the optical element.
14. The fluid purging system of any one of the preceding clauses, wherein the fluid supply system is configured to supply fluid at a rate of approximately 20 nlpm to 150 nlpm, or preferably approximately 70 nlpm to 110 nlpm.
15. A projection system comprising the fluid purging system of any one of the preceding clauses.
16. An illumination system comprising the fluid purging system of any one of clauses 1 to 14.
17. A lithographic apparatus comprising the fluid purging system of any one of clauses 1 to 14.
18. A method of manufacturing a device using the lithographic apparatus of clause 17, wherein the fluid supply system provides fluid to pass over the at least one second wall portion of the ring to the space.

The descriptions above are intended to be illustrative, not limiting. Thus, it will be apparent to one skilled in the art that modifications may be made to the invention as described without departing from the scope of the claims set out below.

The invention claimed is:
1. A fluid purging system for an optical element, comprising:
a ring formed of a body entirely surrounding the optical element, the ring defining a space radially inwards thereof and adjacent to the optical element, the ring formed by at least one first wall portion and at least one second wall portion, wherein an average height of the first wall portion is greater than an average height of the second wall portion;
a fluid supply system positioned radially outwards of the ring and configured to supply fluid to pass over the at least one second wall portion to the space; and
wherein the at least one second wall portion has a height changing in a radial direction.
2. The fluid purging system of claim 1, wherein the at least one first wall portion is configured to restrict flow into or out of the space.
3. The fluid purging system of claim 1, wherein the optical element comprises a lens.
4. The fluid purging system of claim 1, wherein the fluid supply system and the ring are arranged such that a majority of the fluid from the fluid supply system passes radially inwards of the ring, and the rest of the fluid from the fluid supply system flows around an outer periphery of the ring.
5. The fluid purging system of claim 1, wherein the ring comprises at least two first wall portions and at least two second wall portions.
6. The fluid purging system of claim 5, wherein the two first wall portions are provided on opposite sides of the ring to each other, and the two second wall portions are provided on opposite sides of the ring to each other.
7. The fluid purging system of claim 5, wherein one of the at least two second wall portions is aligned with the fluid supply system to provide a fluid inlet to the space and the other of the at least two second wall portions provides a fluid outlet from the space.
8. The fluid purging system of claim 5, further comprising a further fluid supply system positioned radially outwards of the ring, wherein the fluid supply system is configured to supply fluid to pass over one of the at least two second wall portions into the space, and the further fluid supply system is configured to supply fluid to pass over the other of the at least two second wall portions into the space.
9. The fluid purging system of claim 5, further comprising a fluid extraction system configured to extract the fluid from the space.
10. The fluid purging system of claim 5, wherein the at least two first wall portions are configured such that an amount of fluid flowing over the two first wall portions is less than that flowing over the at least one second wall portion.
11. The fluid purging system of claim 5, wherein an edge of the at least one second wall portion is rounded.

12. The fluid purging system of claim 5, wherein the at least one of the second wall portions forms an angle from the center of the ring of approximately 10° to 160°.

13. The fluid purging system of claim 1, configured such that the space is maintained at a pressure larger than a pressure outside of the space.

14. The fluid purging system of claim 1, further comprising a surface opposite the ring, wherein the fluid in the space passes between the surface and the optical element.

15. The fluid purging system of claim 1, wherein the at least one first wall portion has a height changing in the radial direction.

16. The fluid purging system of claim 1, wherein the height of the at least one second wall portion increases from an outer radius of the ring to an inner radius of the ring.

17. The fluid purging system of claim 1, further comprising at least one third wall portion that has a height which differs from the height of the at least one first wall portion and the height of the at least one second wall portion.

18. A projection system comprising the fluid purging system of claim 1.

19. An illumination system comprising the fluid purging system of claim 1.

20. A lithographic apparatus comprising the fluid purging system of claim 1.

* * * * *